United States Patent [19]

Nguyen

[11] Patent Number: 5,399,925
[45] Date of Patent: Mar. 21, 1995

[54] HIGH-SPEED TRISTATE INVERTER

[75] Inventor: Hy V. Nguyen, San Jose, Calif.

[73] Assignee: Xilinx, Inc., San Jose, Calif.

[21] Appl. No.: 101,131

[22] Filed: Aug. 2, 1993

[51] Int. Cl.[6] .................. H03K 19/00; H03K 19/0175
[52] U.S. Cl. .................................. 326/58; 326/86; 326/121
[58] Field of Search ..................... 307/473, 475, 451

[56] References Cited

U.S. PATENT DOCUMENTS

| | | | |
|---|---|---|---|
| 4,345,172 | 8/1982 | Kobayashi et al. | 307/473 |
| 4,465,945 | 8/1984 | Yin | 307/473 |
| 4,717,846 | 1/1988 | Ando | 307/473 |
| 5,023,472 | 6/1991 | Hashimoto et al. | 307/443 |
| 5,027,012 | 6/1991 | Saeki et al. | 307/473 |
| 5,136,185 | 8/1992 | Fleming et al. | 307/443 |
| 5,200,653 | 4/1993 | Moloney et al. | 307/473 |
| 5,294,845 | 3/1994 | McMahan et al. | 307/475 |

Primary Examiner—Edward P. Westin
Assistant Examiner—Richard Roseen
Attorney, Agent, or Firm—Jeanette S. Harms

[57] ABSTRACT

The tristate inverter of the present invention includes an input line, an output line, a first transistor for transferring a high signal to the output line, and a second transistor for transferring a low signal to the output line. The tristate inverter further includes means for isolating the input line from the second transistor, thereby significantly improving the rise time of the signal on the output line.

15 Claims, 3 Drawing Sheets

HIGH-SPEED TRISTATE INVERTER

BACKGROUND OF THE INVENTION

1. Field of the Invention

The present invention relates to inverters used in integrated circuit devices, and in particular to a high-speed, tristate inverter that minimizes switching delay.

2. Description of the Related Art

Tristate devices are well known in the art. In addition to receiving one or more input signals, tristate device receives an additional signal, typically called an output disable signal, for placing the output line of the device into a high impedance state. In a high impedance state, the output line functions as if it is not connected to the rest of the circuit. Thus, an output line of a tristate device typically provides one of three states: logic 0, logic 1, and high impedance.

FIG. 1 illustrates a known tristate inverter 100. Inverter 100 includes four transistors: p-type transistors 101 and 102, and n-type transistors 103 and 104. Referring to FIG. 1, the source S of transistor 101 is connected to a voltage source Vdd, typically 5 volts, whereas the drain D of transistor 101 is connected to the source S of transistor 102. The drain D of transistor 102 is connected to the drain D of transistor 103, as well as the output line 106. The source S of transistor 103 is connected to the drain D of transistor 104, whereas the source S of transistor 104 is connected to another voltage source Vss, typically ground. The gates G of transistors 102 and 103 are coupled to receive signals on input line 105, whereas the gate G of transistor 101 is coupled to receive signals from tristate control 107 and gate G of transistor 104 is coupled to receive the inverted signals from tristate control 107 via inverter 108. Note that inverter 108 inverts the signal from tristate control 107. Thus, a signal provided by tristate control 107 is provided at the gate G of transistor 101, and the complement of that signal is provided at the gate G of transistor 104.

If tristate control 107 provides a low signal, transistor 101 turns on, i.e. conducts, thereby transferring the high voltage from voltage source Vdd to node A. Inverter 108 inverts the low signal provided by tristate control 107, thereby providing a high signal to the gate of transistor 107. This high signal turns on transistor 104, thereby transferring the low voltage from ground to node B.

In this configuration, tristate inverter 100 functions as a conventional inverter. Specifically, a high signal on input line 105 turns on transistor 103 and turns off transistor 102. Because only transistor 103 is conducting, the low voltage on node B is transferred to the output line 106. Conversely, a low signal on input line 105 turns off transistor 103 and turns on transistor 102. Because only transistor 102 is conducting, the high voltage on node A is transferred to output line 106.

Tristate inverter 100 is placed in its high impedance state if tristate control 107 provides a high signal. Specifically, this high signal turns off both transistors 101 and 104. In this high impedance state, output line 106 provides no signal, irrespective of the signal provided on input line 105.

This configuration, however, results in an undesirable time delay during the time that the signal on input line 105 switches from high to low. As mentioned previously, assuming that tristate inverter 100 is in its inverter mode, i.e. tristate control 107 provides a low signal, node A exhibits a high voltage (typically Vdd). When the signal on input line 105 transitions from high to low, the voltage at node A also momentarily dips because of the capacitive coupling between input line 105 and node A (specifically the gate to drain capacitance $C_{GD}$ of transistor 101). The extent of the dip is determined by the size of transistor 101 (note that transistors 101 and 102 are conventionally identically sized). Specifically, the larger the size of transistor 101, the larger the capacitance $C_{GD}$ of transistor 101, thereby decreasing the current needed by transistor 102 to charge up output line 106. Thus, the dip in the voltage on node A creates an undesirable increase in the rise time of the signal on output line 106.

To compensate for this undesirable charging/discharging condition at node A, thereby decreasing the rise time of the signal on output line 106, transistor 102 is typically sized to be relatively large, i.e. commonly at least 100μ wide. However, this increase in the size of transistor 102 creates loading on output line 106, thereby once again increasing the time for the signal transition. Therefore, the prior art solution to the capacitive coupling problem creates a new problem that results in the same effect, i.e. an increased rise time of the signal on line 106.

Thus, a need arises for a tristate inverter which decreases the rise time of the signal on the output line of the inverter.

SUMMARY OF THE INVENTION

In accordance with the present invention, a tristate inverter includes an input line, an output line, a first transistor for transferring a high signal to the output line, and a second transistor for transferring a low signal to the output line. The tristate inverter further includes means for isolating the input line from the second transistor, thereby significantly improving the rise time of the signal on the output line.

In one embodiment of the present invention, the first transistor has its gate coupled to the input line and the second transistor has its source coupled to a first voltage source, typically Vdd. The drains of the first and second transistors are coupled to the output line. The means for isolating includes a third transistor having its source coupled to the first voltage source, a fourth transistor having its source coupled to the drain of the third transistor and its drain coupled to the input line, and a fifth transistor having its drain coupled to the source of the first transistor and its source coupled to a second voltage source, typically Vss. The gates of the third, fourth, and fifth transistors are coupled to a controlled voltage source, and the gate of the second transistor is coupled to the drain of the third transistor. In this embodiment of the present invention, the first, fourth, and fifth transistors are n-type transistors, whereas the second and third transistors are p-type transistors.

Because of the faster rise time, the first and second transistors are sized significantly smaller than prior art transistors. In one embodiment of the present invention, the first and second transistors are approximately 60% smaller than conventional prior art transistors. In this manner, the present invention also significantly reduces the loading on the output line. Therefore, in embodiments in which a plurality of tristate inverters drive an output bus, the present invention also significantly reduces the loading on that output bus.

In accordance with the present invention, the size of the tristate inverter is further reduced by eliminating one transistor of an inverter (an inverter being an n-type transistor coupled to a p-type transistor) required in prior art tristate inverters. Thus, the present invention dramatically reduces the silicon area required for the tristate inverter compared to prior art tristate inverters.

Furthermore, in accordance with the present invention, if the signal on the input line is high, the signal provided between the third and fourth transistors (at a predetermined node) is Vdd minus the threshold voltage Vt (for example 0.8 volts) of the fourth transistor. Thus, as the signal on the input line switches from high to low, the signal on the predetermined node switches from Vdd−Vt, i.e. 5−0.8=4.2 volts, to ground. Because this node switches from 4.2 volts to ground faster than from Vdd (5 volts) to ground (as required in prior art inverters), the first transistor turns on faster, thereby also providing a faster low to high signal transition on the output line.

DETAILED DESCRIPTION OF THE DRAWINGS

Figure 2:
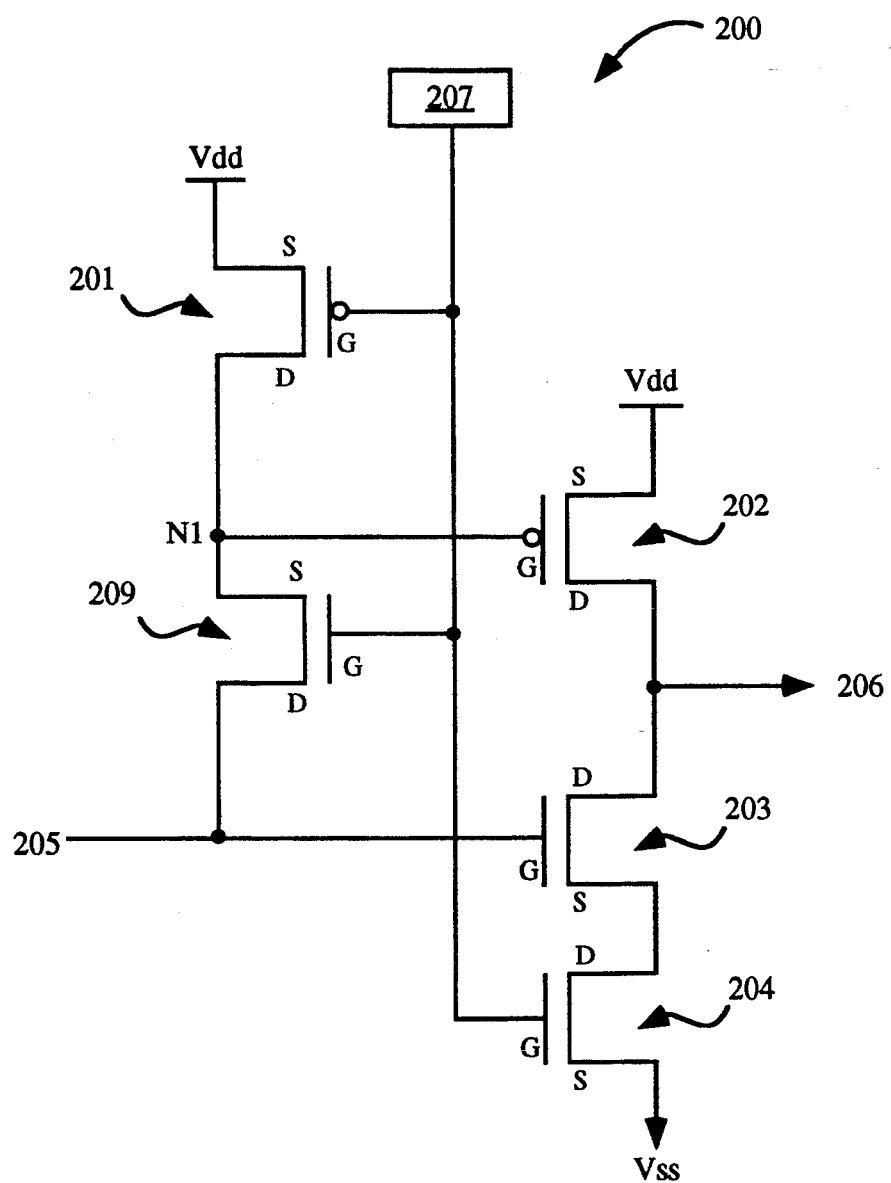
FIG. 2 illustrates a high-speed, tristate inverter in accordance with the present invention.

FIG. 2 illustrates a high-speed, tristate inverter 200 in accordance with the present invention. Tristate inverter 200 includes five transistors: p-type transistors 201 and 202, and n-type transistors 203, 204, and 209. The source S of transistor 201 is connected to voltage source Vdd, typically 5 volts, whereas the drain D of transistor 201 is connected to the node N1, the gate of transistor 202, and the source S of transistor 209. The drain D of transistor 209 is connected to the input line 205 and the gate of transistor 203.

The source S of transistor 202 is also connected to voltage source Vdd, whereas the drain D of transistor 202 is connected to the output line 206 and the drain D of transistor 203. The source S of transistor 203 is connected to the drain D of transistor 204, and the source S of transistor 204 is connected to voltage source Vss, typically ground. The gates of transistors 201, 204, and 209 are connected to the tristate control 207.

In this configuration, if tristate control 207 provides a high signal, thereby turning off transistor 201 and turning on transistors 204 and 209, tristate inverter 200 functions as a conventional inverter. Specifically, because transistor 209 is on, a low signal provided on input line 205 is transferred to node N1. This low signal on node N1 is provided to the gate G of transistor 202, thereby turning on this transistor. In this manner, the high voltage Vdd is transferred via transistor 202 to the output line 206. Note that the low signal on input line 205 turns off transistor 203. In this manner, tristate inverter 200 inverts a low input signal to provide a high output signal.

Conversely, if tristate inverter 200 receives a high signal on input line 205, this high signal is transferred via transistor 209 to node N1 which is provided to the gate G of transistor 202, thereby turning off this transistor. The high signal on input line 205 is also provided to the gate G of transistor 203, thereby turning on transistor 203. In this manner, the low voltage Vss is transferred via transistor 204 and transistor 203 to output line 206. Thus, tristate inverter 200 inverts a high input signal to provide a low output signal.

Tristate inverter 200 provides no output signal if tristate control 207 provides a low signal to the gates G of transistors 201, 204, and 209. This low signal turns on transistor 201 and turns off transistors 204 and 209. Because transistor 201 is on, the high voltage Vdd is transferred to node N1 and to the gate G of transistor 202, thereby turning off this transistor. Because both transistors 202 and 204 are off, output line 206 provides no signal, irrespective of the signal provided on input line 205.

Note that because input line 205 is not connected to the gate of transistor 202, no capacitive coupling affects the transfer of high signal Vdd to output line 206. In this manner, the present invention prevents any undesirable dip in the value of voltage Vdd. Thus, tristate inverter 200 provides a significantly faster rise time than the rise time provided by the prior art.

Figure 1:
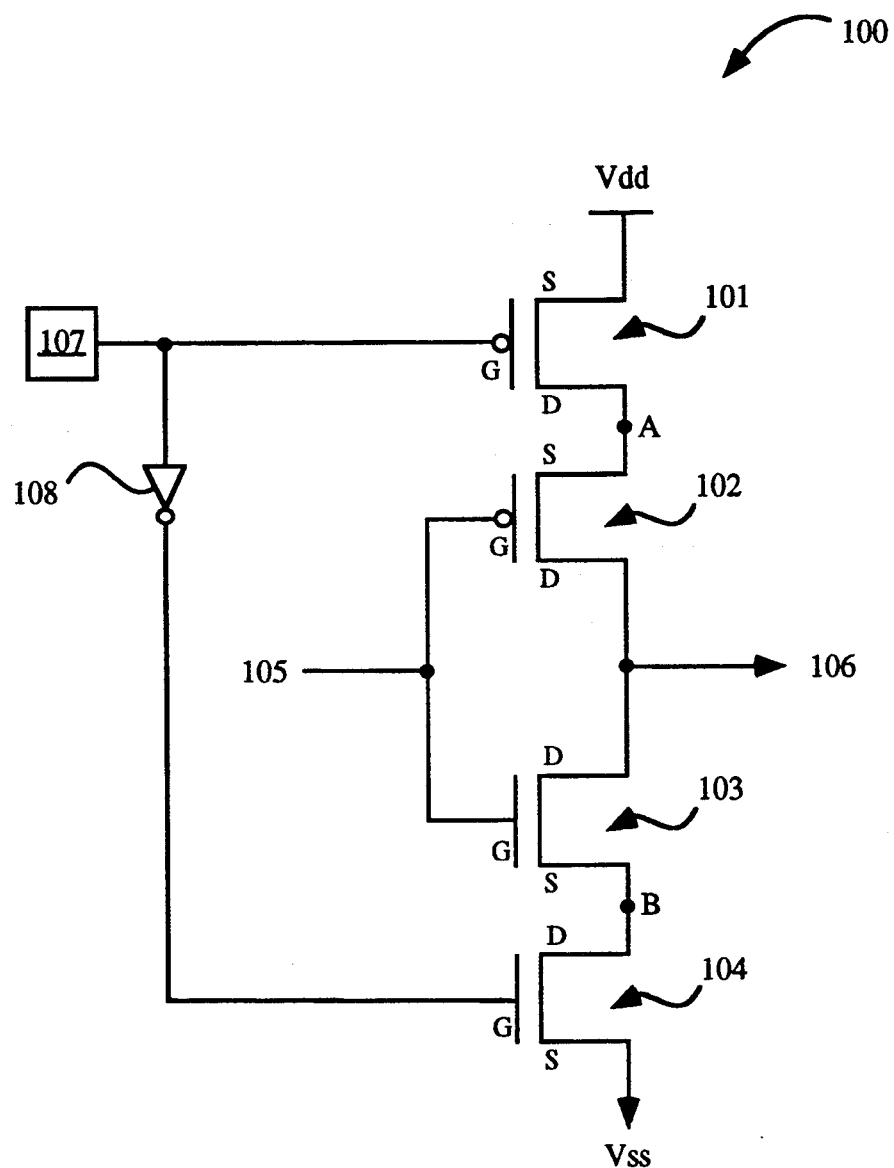
FIG. 1 illustrates a prior art tristate inverter.

Moreover, because of the faster rise time, transistor 202 is sized significantly smaller than transistor 102 (FIG. 1). In one embodiment of the present invention, transistor 202 is 40μ wide, i.e. approximately 60% smaller than transistor 102. The sizes for all transistors in the embodiment shown in FIG. 2 are listed in Table 1 below, where the first number refers to width, while the second number refers to length. All dimensions are in microns.

TABLE 1

| Transistor 201 | 8.4/1 | Transistor 204 | 100/1 |
| Transistor 202 | 40/1  | Transistor 209 | 20/1  |
| Transistor 203 | 40/1  |                |       |

In accordance with the present invention, the size of tristate inverter 200 is further reduced by using only five transistors, whereas prior art transistor inverter 100 requires six transistors. Specifically, transistor 100 includes two n-type transistors (transistors 103 and 104), two p-type transistors (transistors 101 and 102), and one inverter 108. It is well known in the art that an inverter includes one n-type transistor coupled to one p-type transistor (neither transistor shown in FIG. 1 for clarity). Thus, prior art tristate inverter 100 is a six transistor device including three n-type transistors and three p-type transistors. In contrast, in the embodiment shown in FIG. 2, the present invention is a five transistor device including three n-type transistors (transistors 203, 204, and 209) and only two p-type transistors (transistors 201 and 202). Thus, compared to prior art tristate inverter 100, the present invention, by eliminating one p-type transistor, significantly reduces the silicon area required for tristate inverter 200.

Figure 3:
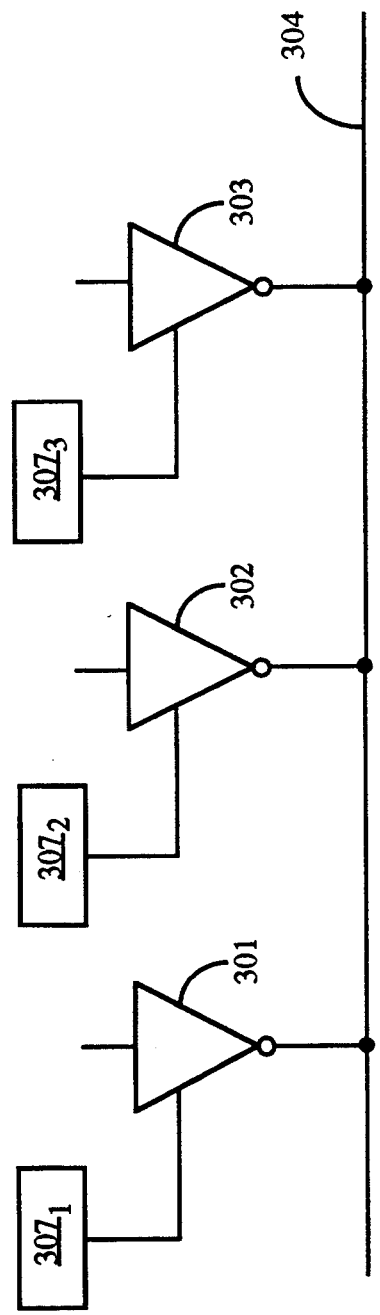
FIG. 3 illustrates one application of the present invention mn which three inverters drive an output bus.

The present invention also significantly reduces the loading on line 206. This reduction is particularly useful in an application, such as that shown in FIG. 3, in which a plurality of tristate inverters 301, 302, and 303, controlled by tristate controllers $307_1$, $307_2$, and $307_3$ respectively, drive an output bus 304. It is well known in the art that each inverter provides an associated capacitance on its output line. The larger the transistor driving the output line, the larger this capacitance. The larger the capacitance, the more loading, and hence the slower the rise time on the output line. Therefore, by reducing the size of the driving transistors in the tristate inverters, the present invention reduces the capacitance on output bus 304, thereby significantly improving the rise time compared to prior art tristate configurations.

Furthermore, in accordance with the present invention, if the signal on input line 205 (FIG. 2) is high, the signal provided on node N1 is Vdd minus the threshold voltage Vt (typically 0.8 volts) of transistor 209. Thus, as the signal on line 205 switches from high to low, node N1 switches from Vdd−Vt, i.e. 5−0.8=4.2 volts, to ground. Because node A switches from 4.2 volts to ground faster than from Vdd (typically 5 volts) to ground, transistor 202 turns on faster than transistor 101 (FIG. 1), thereby also providing a faster low to high signal transition on output line 206.

Therefore, a tristate inverter in accordance with the present invention provides a significantly faster low to high output signal transition, in comparison to prior art tristate inverters. Moreover, the present invention provides this faster output signal transition with a smaller circuit than the prior art, thereby reducing valuable silicon area.

The above embodiment of the present invention is illustrative only and not limiting. For example, in one embodiment of the present invention, the control voltage provided by tristate control 207 is raised to Vdd plus Vt, i.e. the threshold voltage of an n-type transistor. This increased voltage, subsequently provided to the gate G of transistor 209, results in node N1 having a voltage Vdd (rather than Vdd minus Vt). This voltage at node N1, although somewhat increasing the rise time on output line 206 in comparison with the above-described embodiment, increases performance of the circuit by ensuring that no leakage current flows through transistor 202, i.e. that transistor 202 is completely off. In this embodiment, EPROM technology is used with a charge pump to provide the increased voltage. Other embodiments will be apparent to those skilled in the art in light of the detailed description. The present invention is set forth in the appended claims.

I claim:

1. A tristate inverter comprising;
   an input line;
   an output line;
   a first transistor for transferring a signal from a low voltage source to said output line, said first transistor having a gate, a source, and a drain, said gate of said first transistor being coupled to said input line;
   a second transistor for transferring a signal from a high voltage source to said output line, said second transistor having a gate, a source, and a drain, said source of said second transistor being coupled to said high voltage source, said drains of said first and second transistors being coupled to said output line; and
   means for isolating said input line from said second transistor, wherein said means for isolating provides the high impedance state of said tristate inverter, wherein said means for isolating comprises:
   a third transistor having a gate, a source, and a drain, said source of said third transistor being coupled to said high voltage source;
   a fourth transistor having a gate, a source, and a drain, said source of said fourth transistor being coupled to said drain of said third transistor, said drain of said fourth transistor being coupled to said input line; and
   a fifth transistor having a gate, a source, and a drain, said drain of said fifth transistor being coupled to said source of said first transistor and said source of said fifth transistor being coupled to said low voltage source,
   wherein said gates of said third, fourth, and fifth transistors are coupled to a controlled signal source, and said gate of said second transistor is coupled to said drain of said third transistor.

2. The tristate inverter of claim 1 wherein said first, fourth, and fifth transistors are n-type transistors.

3. The tristate inverter of claim 1 wherein said second and third transistors are p-type transistors.

4. The tristate inverter of claim 1 wherein said controlled signal source includes a tristate voltage source.

5. The tristate inverter of claim 3 wherein said third transistor is approximately 40μ wide.

6. The tristate inverter of claim 5 wherein said fourth transistor is approximately 40μ wide.

7. The tristate inverter of claim 1 wherein said gate of said second transistor receives a signal approximately equal to the voltage provided by said high voltage source minus the threshold voltage of said fourth transistor.

8. A tristate inverter comprising:
   an input line;
   an output line;
   a first transistor having a gate, a source, and a drain, wherein said gate of said first transistor is coupled to said input line, and said drain of said first transistor is coupled to said output line;
   a second transistor having a gate, a source, and a drain, wherein said drain of said second transistor is coupled to said output line, and said source of said first transistor is coupled to a first voltage source;
   a third transistor having a gate, a source, and a drain, wherein said source of said third transistor is coupled to said first voltage source;
   a fourth transistor having a gate, a source, and a drain, wherein said source of said fourth transistor is coupled to said drain of said third transistor, and said drain of said fourth transistor is coupled to said input line; and
   a fifth transistor having a gate, a source, and a drain, wherein said drain of said fifth transistor is coupled to said Source of said first transistor, and said source of said fifth transistor is coupled to a second voltage source;
   wherein said gates of said third, fourth, and fifth transistors are coupled to a controlled signal source, and said gate of said second transistor is coupled to said source of said fourth transistor.

9. The tristate inverter of claim 8 wherein said first, fourth, and fifth transistors are n-type transistors.

10. The tristate inverter of claim 8 wherein said second and third transistors are p-type transistors.

11. The tristate inverter of claim 8 wherein said controlled signal source includes a tristate voltage source.

12. The tristate inverter of claim 10 wherein said third transistor is approximately 40μ wide.

13. The tristate inverter of claim 13 wherein said fourth transistor is approximately 40μ wide.

14. The tristate inverter of claim 8 wherein said gate of said second transistor receives a signal approximately equal to the voltage provided by said first voltage source minus the threshold voltage of said fourth transistor.

15. A circuit for driving a bus, said circuit comprising:
   a plurality of inverters, each inverter having an input line and an output line, the output lines of said plurality of inverters forming said bus, wherein each inverter includes:
a first transistor having a gate, a source, and a drain, said gate of said first transistor coupled to said input line;
a second transistor having a gate, a source, and a drain, said source of said second transistor coupled to a first voltage source, said drains of said first and second transistors coupled to said output line;
a third transistor having a gate, a source, and a drain, said source of said third transistor coupled to said first voltage source;
a fourth transistor having a gate, a source, and a drain, said source of said fourth transistor coupled to said drain of said third transistor, said drain of said fourth transistor coupled to said input line; and
a fifth transistor having a gate, a source, and a drain, said drain of said fifth transistor coupled to said source of said first transistor and said source of said fifth transistor coupled to a second voltage source,
wherein said gates of said third, fourth, and fifth transistors are coupled to a controlled signal source, and said gate of said second transistor is coupled to said drain of said third transistor.

* * * * *